United States Patent [19]

Geffken

[11] 4,109,372
[45] Aug. 29, 1978

[54] METHOD FOR MAKING AN INSULATED GATE FIELD EFFECT TRANSISTOR UTILIZING A SILICON GATE AND SILICIDE INTERCONNECTION VIAS

[75] Inventor: Robert Michael Geffken, Burlington, Vt.

[73] Assignee: International Business Machines Corporation, Armonk, N.Y.

[21] Appl. No.: 793,231

[22] Filed: May 2, 1977

[51] Int. Cl.² .............................................. B01J 17/00
[52] U.S. Cl. ........................................ 29/571; 29/578; 29/590
[58] Field of Search .................. 29/571, 578, 590, 591

[56] References Cited

U.S. PATENT DOCUMENTS

| 3,571,913 | 3/1971 | Bodway | 29/578 |
| 3,740,835 | 6/1973 | Duncan | 29/578 |
| 3,935,635 | 2/1976 | Botzenhardt | 29/578 |
| 3,967,364 | 7/1976 | Kawamoto | 29/578 |

*Primary Examiner*—W. Tupman
*Attorney, Agent, or Firm*—Howard J. Walter, Jr.

[57] ABSTRACT

The invention disclosed pertains to a method for the manufacture of an integrated insulated gate field effect transistor semiconductor device wherein a silicon gate structure is simultaneously formed with a composite layer of silicon and a conductive silicide forming metal which upon subsequent annealing forms a conductive metallic silicide compound within the via interconnection means. The aforesaid structure is accomplished utilizing a photoresist lift-off technique as a masking material as well as a substance per se or in combination with other materials to define evaporative conductive metal dimensions on a diffused silicon substrate.

9 Claims, 9 Drawing Figures

METHOD FOR MAKING AN INSULATED GATE FIELD EFFECT TRANSISTOR UTILIZING A SILICON GATE AND SILICIDE INTERCONNECTION VIAS

BACKGROUND OF THE INVENTION

1. Field of the Invention

This invention relates generally to the methods and structures of providing semiconductor devices and more particularly to such structure and method of providing a semiconductive matrix of a plurality of silicon oxide silicon (SOS) transistor-memory elements disposed on a semiconductor chip.

2. Description of the Prior Art

Field effect transistor integrated memory devices and processes for the fabrication thereof are well known at this time. The commonly assigned Dennard U.S. Pat. No. 3,387,286 discloses such circuits and methods of making the same. Although the teachings of the Dennard patent have been available for many years, a memory cell of such simplicity has not been commercially exploited until recently when process technology has become more adequately understood and processing techniques and methods developed to a point of making commercial exploitation of said devices economical.

U.S. Pat. No. 3,841,926 of Garnache et al. teaches a method for fabricating integrated circuits of high density wherein is provided a process which allows the use of multiple conducting layers in a dielectric above the semiconductor substrate having diffused areas of opposite conductivity type and utilizing polycrystalline silicon (polysilicon) dually as a field shield and a capacitor plate. Semiconductor devices of the character heretofore referred to are generally MNOS type wherein a composite dielectric is utilized e.g. silicon dioxide and silicon nitride. This type of structure exhibits certain undesirable conditions which make the device inefficient, and impractical for use in a memory array. These conditions are such as electron injection into the interface area of the dual dielectric which causes the device to be partially operative in an off condition. Likewise, the gate and edge abutting, for example a polysilicon field shield will accumulate electrons believed due to field variations causing a difference in threshold voltage requirements between the center portion and the end portion of the gate area.

A structure of the type (MNOS) described above is illustrated in U.S. Pat. No. 3,925,804 to Cricchi. U.S. Pat. No. 3,893,160 to Botzenhardt discloses a resistive connecting contact for a silicon semiconductor component comprising, on a semiconductor body, a layer sequence including a metallic silicide in composite form with other metals such as titanium-molybdenum-gold. The disclosure also contains a description of the method for making such a contact.

The use of aluminum-copper conducting contact metal is described and shown in U.S. Pat. No. 3,879,840. In U.S. Pat. No. 3,858,304 a process is disclosed for fabricating small geometry semiconductor devices wherein an active region or regions are formed in a semiconductor layer and metallization patterns are formed on the surface thereof, while a photoresist pattern which is used to define the geometry of these regions and patterns is left temporarily in place between metal and semiconductor. Subsequently, the resist is lifted off, the surface of the oxide located between the metal and semiconductive layer and whose geometry it controlled and carrying with it the metallization lying on the resist surface and leaving narrow strips of metallization in contact with the active regions.

In U.S. Pat. No. 3,777,364 a metal silicide is used to form an interconnect layer of conductive material on a semiconductor device. This disclosure teaches the forming of a platinum silicide on a polycrystalline silicon material which adheres to the underlying oxide. This is accomplished by combining the platinum and the polycrystalline silicon by heating to about 850° C.

U.S. Pat. No. 3,740,835 discloses a semiconductor device contact made by depositing a layer of semiconductor material in a contact opening of an insulating mask, metallizing and heating to bond the metal to the layer of semiconductor material and to the original device surface for permitting greater ease of contacting shallow junctions.

SUMMARY OF THE INVENTION

It is an object of this invention to provide a method of fabricating a semiconductor insulated gate field effect transistor structure having a silicon on a silicon dioxide dielectric gate structure and conductive metallic silicide interconnection metal contact areas for the diffused areas of opposite conductivity to that of the substrate semiconductor material, as well as to said substrate.

It is a further object of this invention to provide a method for the fabrication of an insulated gate field effect transistor whereby a silicon gate is formed simultaneously with the deposition of silicon upon a contact silicide forming metal.

It is a further object of this invention to provide a method for fabricating insulated gate field effect transistor devices having silicon gate structures and Al—Cu interconnection patterns defined by the same photosensitive polymeric lift-off technique.

It is still a further object of this invention to provide in an insulated gate field effect transistor structure source and drain diffusion contacts formed of a conductive metallic silicide.

It is still a further object of this invention to provide a method for fabricating insulated gate field effect transistor devices having silicon gate structures and metallic silicide contacts utilizing a photosensitive polymeric lift-off technique.

The aforesaid objects and other related objects are achieved by utilizing the integrated circuit fabrication process described herein.

In accordance with the invention after diffusions of first conductivity type are formed in a substrate of a second conductivity type by any suitable means e.g. doped oxide drive-in, ion implantation, open or closed tube type diffusion techniques and the like to form the source and drain regions of an insulated gate field effect transistor and followed by the formation of an insulating dielectric layer or structure a layer of photosensitive material is deposited to cover said structure and superimposed thereon is deposited a layer of silicon and which is covered by a second layer of photosensitive material which utilizing known photolithography is opened over the first conductivity type diffusion area to a depth of said silicon layer whereupon the exposed silicon is etched away to said first deposited photoresist layer. The well known blanket expose and develop photolithography is undertaken thereby forming a lift-off structure and allowing the oxide layer 3 in said opening 5 to be etched away to a depth of said first conductivity type diffusion using a conventional silicon dioxide etchant. Silicide forming metal is deposited over the remaining complete structure thereby depositing said silicide forming metal on the exposed diffusion followed by a removal of the remaining photoresist material utilzing a suitable solvent which carries off the superimposed metal thereon as a result of said metal deposition and resulting in a metal deposition in said opening and imposed on said first conductivity diffusion.

A similar lift-off procedure is repeated upon the aforesaid resulting structure except that all areas are covered with photosensitive material except those desired for interconnections which includes the deposited metal contact hole and the gate area located between the source and drain diffusions and whereupon is deposited a layer of silicon and a layer of copper doped aluminum metallization. Photolithography lift-off procedures remove all of the first silicon layer and said copper doped aluminum metallization superimposed thereon from all areas of the substrate except those areas used for interconnections including: the gate and diffusion via contact hole having said silicide forming metal previously deposited thereon; thereby simultaneously forming a silicon gate and a silicon and metal composite diffusion contact which upon an elevated temperature anneal said metal and silicon form a metal silicide in contact with copper doped aluminum and a silicon gate in contact with copper doped aluminum gate contact.

DESCRIPTION OF PREFERRED EMBODIMENTS

Figure 1:
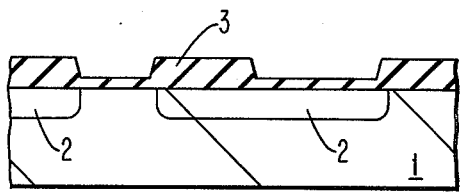
FIGS. 1 through 9 represent cross sections of a portion of an integrated circuit after successive process steps during fabrication in accordance with the process of this invention and where like parts and elements are designated by like numerals.

Referring to the drawings, FIG. 1 illustrates a sectional view of a typical silicon substrate 1 of second conductivity type and having diffusions 2 capable of forming a source and drain in an integrated insulated gate field effect transistor and having an insulating layer of oxide ($SiO_2$) 3 formed on the surface of said substrate using any well known method, and forming a gate area intermediate said diffusions.

Figure 2:
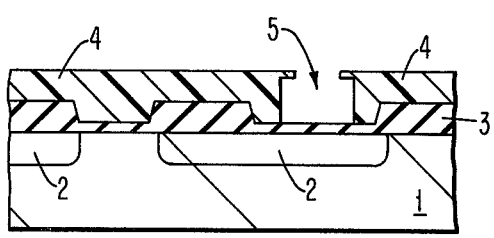
Figure 3:
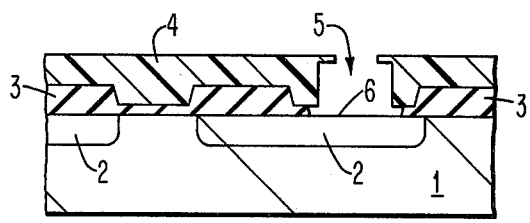

FIG. 2 illustrates the structure 1 having deposited thereon a photoresist material 4 patterned for the diffusion area opening 5. Using conventional photolithography techniques of expose and develop, the opening 5 is formed to a depth sufficient to reach and expose the oxide layer 3 within said opening. The exposure of the oxide layer allows an etch procedure such as chemical dip using 10:1 buffered hydrogen fluoride solution, plasma, sputtering and the like to thereby expose the surface of diffusion 2 and form the opening to the diffusion surface 6 as illustrated in FIG. 3.

Figure 4:
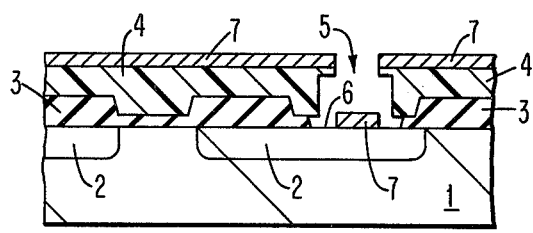
Figure 5:
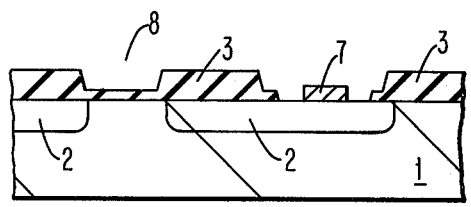

At this posture in the processing a silicide forming metal, such as for example as found in Group VIII of the Periodic Table, and especially platinum and palladium, is deposited over the structure and into the opening 5 as shown in FIG. 4. However, other silicide forming metals, well known in the art are also contemplated, and may be deposited by evaporative techniques or any other suitable method. As a result thereof the metal 7 is deposited within the opening 5 and upon the upper surface of the photoresist 4. The dimension and configuration of the deposited metal 7 will be controlled by the size of the opening 5. Following the metal deposition, any well known photoresist solvent is applied by dip, spray or otherwise to the structure of FIG. 4, thereby removing or lifting-off the resist layer 4 which in turn carries away or removes the metal 7 from the structure as shown in FIG. 4 and thereby forming a structure illustrated by FIG. 5. FIG. 5 demonstrates the basic elements of an insulated gate field effect transistor (FET) namely, the diffusions 2 forming source and drain regions and an insulated gate area 8 and a channel area between said source and drain diffusions.

Figure 6:
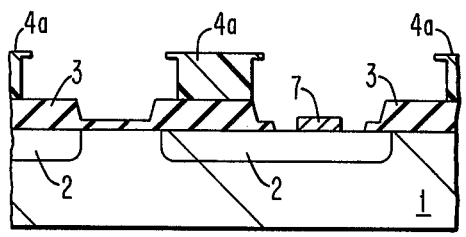
Figure 7:
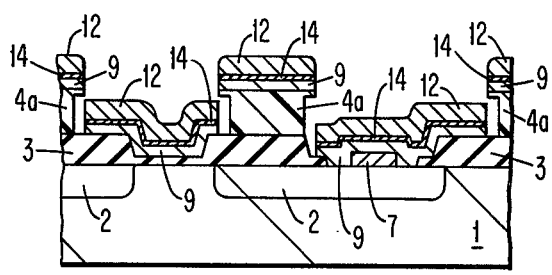
Figure 8:
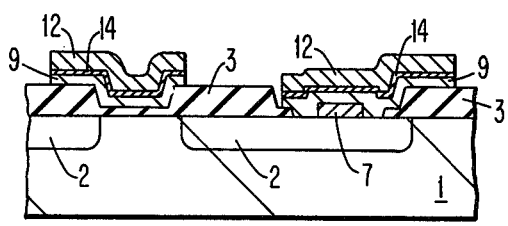

Having formed the structure of FIG. 5, another photolithography lift-off procedure is undertaken as illustrated in FIGS. 6, 7, and 8. Here a photoresist layer 4a is deposited and patterned by masking and utilizing conventional photolithography techniques of exposure and developing to form a structure as illustrated by FIG. 6. Subsequently, a layer of silicon 9 is deposited in the gate area and in the via diffusion contact opening upon the silicide forming metal as shown in FIG. 7. Said silicon deposition may be followed by deposition of a metal 14 which acts as a barrier to silicon and aluminum inter-diffusion such as tantalum or titanium and then by a conductive interconnection metal 12 such as an aluminum copper alloy. Interconnection metal 12 is to form interconnection between gates, diffusions, and substrate utilizing a single photosensitive lift-off mask. Whereupon the structure is treated, by submersion or other suitable means, to subject the photoresist to an appropriate solvent whereby a lift-off takes place disposing of all metal deposited upon the photoresist material and producing a structure as shown in FIG. 8.

Figure 9:
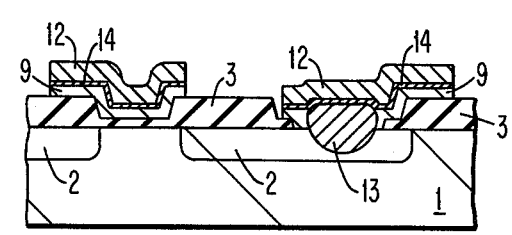

After the formation of the structure shown in FIG. 8, the device is heat treated or annealed at a temperature of between 200° C. to 550° C. depending upon the temperature required to form the silicide composition with the particular metal 7 deposited. Palladium or nickel has been found especially adaptable for this purpose. The anneal time will be dependent upon the metal utilized. A temperature of 400° C. for a period of 20 minutes can be used to form a palladium silicide contact 13 between diffusion 2 and interconnection metals 14 and 12 as shown in FIG. 9. This structure of FIG. 9 results in a silicon-silicon dioxide-silicon gate structure wherein the silicon deposition for the gate area and the contact via is deposited simultaneously which is immediately followed by deposition of the aluminum-copper interconnection metallurgy. This avoids a double masking step for defining the gate and interconnection layers.

A silicide forming metal stud 13 forming a conductive via through subsequently deposited silicon semiconductor film is achieved by reaction of the silicide forming metal 7 with the silicon 9 to form a conductive silicide phase. Normally it would require a photoresist masking step and etch of a via hole through the deposited silicon film. Likewise, the "lift-off" technique of this invention provides a self-aligned contact feature.

The film deposition thickness and diffusion depth are a matter of choice depending upon the ultimate nature of the device required and the configuration and support of an array utilized for a memory device.

While the invention has been particularly shown and described with reference to preferred embodiment thereof, it will be understood by those skilled in the art that the foregoing and other changes in form and details may be made therein without departing from the spirit and scope of the invention.

What is claimed is:

1. In a method for the fabrication of an insulated gate field effect transistor, the steps comprising:
   (a) providing a semiconductor substrate of first conductivity type having therein spaced apart diffusions of a second conductivity type forming a gate area therebetween and having superimposed on said structure a dielectric layer;
   (b) providing contact holes spaced from said gate area through said dielectric layer and selectively depositing a silicide forming metal therein;
   (c) selectively depositing a polycrystalline silicon layer in said gate area between said diffusions on said dielectric layer and upon said selectively deposited silicide forming metal;
   (d) depositing a metallic interconnection layer on said polycriptalline silicon layer; and
   (e) heating said structure to an elevated temperature to form a conductive metallic silicide contact between said substrate and said metallic interconnection layer.

2. A claim in accordance with claim 1 wherein said silicide forming metal is one selected from Group VIII of the Periodic Table.

3. A claim in accordance with claim 1 wherein said dielectric is silicon dioxide.

4. A claim in accordance with claim 1 wherein said metallic interconnection layer is an aluminum copper alloy.

5. A claim in accordance with claim 1 wherein said elevated temperature is between 200° C and 550° C.

6. A claim in accordance with claim 1 wherein said substrate of first conductivity type is silicon.

7. In a method for the fabrication of an insulated gate field effect transistor, the steps comprising:
   (a) providing a semiconductor substrate of first conductivity type having therein two spaced apart, juxtapositioned diffusions of a second conductivity type forming a gate area therebetween and having superimposed on said structure a dielectric layer;
   (b) providing a contact hole through said dielectric layer to at least one of said diffusions and then selectively depositing a silicide forming metal utilizing a first photolithographic mask;
   (c) selectively depositing a polycrystalline silicon layer on said dielectric layer in the area between said diffusions and on said silicide forming metal, and, thereafter, superimposing on said polycrystalline silicon layer an interconnection metal layer utilizing a single second photolithographic mask; and
   (d) removing said second mask and heating the resultant device to a temperature between 200° C and 550° C.

8. A claim in accordance with claim 7 wherein said silicide forming metal is selected from the group consisting of Palladium, Platinum, Rhodium and Nickel.

9. A claim in accordance with claim 7 wherein said interconnection metal layer is an alloy of copper and aluminum.

* * * * *